(12) United States Patent
Kong et al.

(10) Patent No.: US 6,768,660 B2
(45) Date of Patent: Jul. 27, 2004

(54) MULTI-CHIP MEMORY DEVICES AND MODULES INCLUDING INDEPENDENT CONTROL OF MEMORY CHIPS

(75) Inventors: Eun Youp Kong, Kyonggi-do (KR); Jun Young Jeon, Seoul (KR); Hai Jeong Shon, Kyonggi-do (KR); Chul Hong Park, Kyonggi-do (KR)

(73) Assignee: Samsung Electronics Co. Ltd. (KR)

( * ) Notice: Subject to any disclaimer, the term of this patent is extended or adjusted under 35 U.S.C. 154(b) by 175 days.

(21) Appl. No.: 09/920,062

(22) Filed: Aug. 1, 2001

(65) Prior Publication Data

US 2002/0088633 A1 Jul. 11, 2002

(30) Foreign Application Priority Data

Jan. 8, 2001 (KR) ............................................ 2001-1019

(51) Int. Cl.[7] ................................................ G11C 5/02
(52) U.S. Cl. ........................... 365/51; 365/63; 257/787; 257/203; 438/112; 438/124
(58) Field of Search ............................. 365/51, 63, 52; 257/737, 203, 706, 777, 778, 787, 798; 438/112, 124, 127

(56) References Cited

U.S. PATENT DOCUMENTS

| | | | | |
|---|---|---|---|---|
| 4,441,075 A | * | 4/1984 | McMahon | ................... 714/731 |
| 4,494,066 A | * | 1/1985 | Goel et al. | ................... 714/726 |
| 4,503,386 A | * | 3/1985 | DasGupta et al. | .......... 714/731 |
| 5,637,828 A | * | 6/1997 | Russell et al. | ............. 174/52.2 |
| 6,433,422 B1 | * | 8/2002 | Yamasaki | .................... 257/725 |
| 6,438,012 B1 | * | 8/2002 | Osaka et al. | .................. 365/52 |

* cited by examiner

Primary Examiner—David Nelms
Assistant Examiner—Long Tran
(74) Attorney, Agent, or Firm—Myers Bigel Sibley & Sajovec

(57) ABSTRACT

Multi-chip memory devices include at least two integrated circuit memory chips, each of which includes corresponding address pads, data pads and control signal pads, and a common package that encapsulates the at least two integrated circuit memory chips, and that includes external terminals. An internal connection circuit in the common package is configured to connect at least one of the corresponding control signal pads of each of the integrated circuit memory chips to separate ones of the external terminals, to allow independent external control of each of the integrated circuit memory chips that are encapsulated in the common package. Multi-chip memory devices may be combined to form memory modules. The memory modules include a memory module substrate having first and second opposing surfaces. At least one multi-chip memory device, as described above, is provided on the first surface and on the second surface.

19 Claims, 11 Drawing Sheets

FIG.3 (RELATED ART)

| Pin | Signal | | Pin | Signal |
|---|---|---|---|---|
| 1 | VDD | | 54 | VSS |
| 2 | DQ0 | | 53 | DQ15 |
| 3 | VDDQ | | 52 | VSSQ |
| 4 | DQ1 | | 51 | DQ14 |
| 5 | DQ2 | | 50 | DQ13 |
| 6 | VSSQ | | 49 | VDDQ |
| 7 | DQ3 | | 48 | DQ12 |
| 8 | DQ4 | | 47 | DQ11 |
| 9 | VDDQ | | 46 | VSSQ |
| 10 | DQ5 | | 45 | DQ10 |
| 11 | DQ6 | | 44 | DQ9 |
| 12 | VSSQ | | 43 | VDDQ |
| 13 | DQ7 | | 42 | DQ8 |
| 14 | VDD | | 41 | VSS |
| 15 | LDQM | | 40 | N.C/RFU |
| 16 | WEB | | 39 | UDQM |
| 17 | CASB | | 38 | CLK |
| 18 | RASB | | 37 | CKE |
| 19 | CSB | | 36 | A12 |
| 20 | BA0 | | 35 | A11 |
| 21 | BA1 | | 34 | A9 |
| 22 | A10/AP | | 33 | A8 |
| 23 | A0 | | 32 | A7 |
| 24 | A1 | | 31 | A6 |
| 25 | A2 | | 30 | A5 |
| 26 | A3 | | 29 | A4 |
| 27 | VDD | | 28 | VSS |

FIG.6 (RELATED ART)

| Left | Right |
|---|---|
| VDD — 1 | 54 — VSS |
| DQ0 — 2 | 53 — DQ7 |
| VDDQ — 3 | 52 — VSSQ |
| N.C — 4 | 51 — N.C |
| DQ1 — 5 | 50 — DQ6 |
| VSSQ — 6 | 49 — VDDQ |
| N.C — 7 | 48 — N.C |
| DQ2 — 8 | 47 — DQ5 |
| VDDQ — 9 | 46 — VSSQ |
| N.C — 10 | 45 — N.C |
| DQ3 — 11 | 44 — DQ4 |
| VSSQ — 12 | 43 — VDDQ |
| N.C — 13 | 42 — N.C |
| VDD — 14 | 41 — VSS |
| N.C — 15 | 40 — N.C/RFU |
| WEB — 16 | 39 — DQM |
| CASB — 17 | 38 — CLK |
| RASB — 18 | 37 — CKE |
| CSB — 19 | 36 — A12 |
| BA0 — 20 | 35 — A11 |
| BA1 — 21 | 34 — A9 |
| A10/AP — 22 | 33 — A8 |
| A0 — 23 | 32 — A7 |
| A1 — 24 | 31 — A6 |
| A2 — 25 | 30 — A5 |
| A3 — 26 | 29 — A4 |
| VDD — 27 | 28 — VSS |

FIG.8

| Pin | Signal | Pin | Signal |
|---|---|---|---|
| 1 | VDD | 54 | VSS |
| 2 | DQ0 | 53 | DQ7 |
| 3 | VDDQ | 52 | VSSQ |
| 4 | N.C | 51 | N.C |
| 5 | DQ1 | 50 | DQ6 |
| 6 | VSSQ | 49 | VDDQ |
| 7 | N.C | 48 | N.C |
| 8 | DQ2 | 47 | DQ5 |
| 9 | VDDQ | 46 | VSSQ |
| 10 | N.C | 45 | N.C |
| 11 | DQ3 | 44 | DQ4 |
| 12 | VSSQ | 43 | VDDQ |
| 13 | N.C | 42 | N.C |
| 14 | VDD | 41 | VSS |
| 15 | CSB1 | 40 | CKE1 |
| 16 | WEB | 39 | DQM |
| 17 | CASB | 38 | CLK |
| 18 | RASB | 37 | CKE0 |
| 19 | CSB0 | 36 | A12 |
| 20 | BA0 | 35 | A11 |
| 21 | BA1 | 34 | A9 |
| 22 | A10/AP | 33 | A8 |
| 23 | A0 | 32 | A7 |
| 24 | A1 | 31 | A6 |
| 25 | A2 | 30 | A5 |
| 26 | A3 | 29 | A4 |
| 27 | VDD | 28 | VSS |

MULTI-CHIP MEMORY DEVICES AND MODULES INCLUDING INDEPENDENT CONTROL OF MEMORY CHIPS

RELATED APPLICATION

This application claims the benefit of Korean Patent Application No. 2001-1019, filed Jan. 8, 2001, the disclosure of which is hereby incorporated herein by reference in its entirety as if set forth fully herein.

FIELD OF THE INVENTION

The present invention relates to memory devices, and more particularly to multi-chip memory devices that include at least two chips in one package, memory modules including the multi-chip memory devices, and control methods for the multi-chip memory devices and memory modules.

BACKGROUND OF THE INVENTION

Integrated circuit memory chips are widely used in consumer and commercial applications. In these applications, it may be desirable to increase the amount of memory that can be packaged in a given area or volume. Accordingly, multi-chip memory devices have been used, wherein at least two integrated circuit memory chips are encapsulated in a common package that includes a plurality of external terminals. It is also known to mount a plurality of multi-chip memory devices on first and second opposing surfaces of a memory module substrate, to provide a memory module.

For example, a 144-pin/200-pin memory module mounted on a main board of a notebook computer can include a small outline dual in-line memory module (SODIMM) having a width of 1.25 inches, a height of 2.66 inches and a thickness of 0.15 inches and a micro-dual in-line memory module (μ-DIMM) having a width of 1.18 inches, a height of 1.5 inches and a thickness of 0.15 inches. The size of the memory module is determined in accordance with the joint electronic devices engineering council (JEDEC) standard. On such a memory module, up to four synchronous dynamic random access memory (SDRAM) of a 54-pin thin small outline package (TSOP) type can be mounted on both its front surface and its rear surface, respectively.

FIGS. 1A and 1B are plan views illustrating, respectively, configurations of a front surface and a rear surface of a conventional 144-pin/200-pin memory module. As shown in FIGS. 1A and 1B, the front surface 10 of the module includes four memory devices 12-1 to 12-4, and the rear surface 20 also includes four memory devices 22-1 to 22-4. On both the front and rear surfaces 10 and 20 of the memory module, signal lines are arranged to connect the memory devices 12-1 to 12-4 and 221 to 22-4 with connecting pins 14-1, 14-2, 24-1, and 24-2. The connecting pins 14-1 and 14-2 of the front surface 10 and the connecting pins 24-1 and 24-2 of the rear surface 20 are connected with signal lines of a main board or motherboard through slots of the main board. A pin configuration of the memory module includes 12 input pins, 2 bank selecting signal pins, 64 data input/output pins, one row address strobe pin, one column address strobe pin, one write enable signal pin, 8 data input/output mask pins, and a predetermined number of no-connection pins.

FIG. 2 is a cross-sectional view of an SDRAM of the TSOP type for mounting on the module shown in FIG. 1. As shown in FIG. 2, the memory device includes an encapsulating package 30, a chip 32, lead frames 34-1 and 34-2, pads 361 and 36-2, insulating materials 38-1 and 38-2, and bonding wires 40-1 and 40-2. The chip 32 and the lead frames 34-1 and 34-2 are respectively insulated by the insulating materials 38-1 and 38-2, and the lead frames 34-1 and 34-2 and the pads 36-1 and 362 are respectively connected with each other via the bonding wires 40-1 and 40-2. The lead frames 34-1 and 34-2 are used as signal input/output pins.

FIG. 3 is a plan view illustrating a pin configuration of an SDRAM of the 54-pin TSOP type. Pin numbers 1, 14 and 27 denote a power supply (VDD) pin. Pin numbers 28, 41 and 54 denote a power supply ground pin. Pin numbers 3, 9, 43 and 49 denote data output power pins. Pin numbers 6, 12, 46 and 52 denote data output power ground pins. Pin number 16 denotes a write enable signal (WEB) applying pin. Pin number 17 denotes a column address strobe signal (CASB) applying pin. Pin number 18 denotes a row address strobe signal (CASB) applying pin. Pin number 19 denotes a chip select signal (CSB) applying pin. Pin numbers 20 and 21 denote bank select address (BA0, BA1) applying pins. Pin numbers 22 to 26 and 29 to 36 denote address (A0 to A12) applying pins. Pin number 37 denotes a clock enable signal (CKE) applying pin. Pin number 38 denotes a system clock signal (CLK) applying pin. Pin numbers 15 and 39 denote data input/output mask signal (LDQM, UDQM) applying pins. Pin numbers 2, 4, 5, 7, 8, 10, 11, 13, 42, 44, 45, 47, 48, 50, 51 and 53 denote data chip/output signal (DQ0 to DQ15) pins. Pin number 40 denotes a no-connection pin.

A chip select signal (CSB) applied to the chip select signal (CSB) applying pin enables inputting of signals inputted to all the pins described above except the system clock signal (CLK) applying pin, the clock enable signal (CKE) applying pin and the data input/output mask signal (LDQM, UDQM) applying pins, so that an operation of the memory device is enabled. The system clock signal (CLK) applying pin is a pin for inputting the clock signal applied from a controller of the main board. Particularly, the clock enable signal (CKE) applying pin may be used as a control signal applying pin for a power-down mode of the notebook computer.

FIG. 4 is a plan view illustrating the memory devices mounted on the memory module of FIG. 1 and control signal lines. The memory module of FIG. 4 is 256M byte memory module on which eight memory devices 12-1 to 12-4 and 22-1 to 22-4 of 16M×16 bits are mounted. In FIGS. 1 and 4, like reference numerals denote like parts.

The memory devices 12-1 to 12-4 arranged in a dotted line portion 10' are the memory devices mounted on the front surface 10 of the memory module. An operation of the memory devices 12-1 to 12-4 is enabled in response to the chip select signal (CSB0), and the system clock signal (CLK0) is enabled in response to the clock enable signal (CKE0), so that data is input or output in response to the system clock signal (CLK0). Data of 16 bits is input into or output from each of the memory devices 12-1 to 12-4, and therefore the total data input into or output from the memory devices 12-1 to 12-4 is 64 bits.

The memory devices 22-1 to 22-4 arranged in a dotted line portion 20' are the memory devices mounted on the rear surface 20 of the memory module. An operation of the memory devices 22-1 to 22-4 is enabled in response to the chip select signal (CSB1), and the system clock signal (CLK1) is enabled in response to the clock enable signal (CKE1), so that data is input or output in response to the system clock signal (CLK1). Data of 16 bits is input into or output from each of the memory devices 22-1 to 22-4, and therefore the total data input into or output from the memory devices 22-1 to 22-4 is 64 bits.

Other signal lines, which are not shown in FIG. 4, are connected to each other via common signal lines. That is, as shown in FIG. 4, in the 256M byte memory module, four memory devices of 16M×16 bits are respectively mounted on both its front surface 10 and its rear surface 20. The four memory devices arranged on the front surface 10 and the four memory devices arranged on rear surface 20 can be operated independent from each other in order to input/output data of 64 bits into/from the 256M byte memory module. As shown in FIG. 4, in case the four memory devices mounted on the front and rear surfaces 10 and 20 are separately operated, in order to increase a capacity of the memory module, it may be desirable to increase the capacity of the memory devices. For example, in order to configure a 512M byte memory module, four memory devices of 16M×16 bits may respectively be mounted on both the front and rear surfaces of the memory module. However, these high capacity memory modules may be difficult to manufacture. Also, when the memory devices are operated as shown in FIG. 4, it may be difficult to configure a memory module having a large capacity using the memory devices having a small capacity.

In efforts to overcome these and/or other potential problems, four memory devices, which are configured such that two TSOP packages of 32M×8 bits are stacked, are mounted on both the front surface 10 and the rear surfaces 20, so that the memory module may have a capacity of 512M byte. However, since the memory module is configured in such a way that two packages are stacked, the memory device may become too thick.

In efforts to overcome these and/or other potential problems, a memory module that packages two chips into one package has been introduced. FIG. 5 is a cross-sectional view of a multi-chip memory device wherein two chips are encapsulated into one package. As shown in FIG. 5, the multi-chip memory device includes upper and lower chips 52-1 and 52-2 disposed to be opposite to each other and a common package 50 that encapsulates the upper and lower chips 52-1 and 52-2. The upper chip 52-1 includes first and second lead frames 54-1 and 54-2, first and second insulating materials 56-1 and 56-2, first and second pads 58-1 and 58-2, and first and second bonding wires 60-1 and 60-2. The lower chip 52-2 includes first and second lead frames 54-3 and 54-4, first and second insulating materials 56-3 and 56-4, first and second pads 58-3 and 58-4, and first and second bonding wires 60-3 and 604. 4.

In the multi-chip memory device of FIG. 5, the first lead frame 54-1 of the upper chip 52-1 and the first lead frame 54-3 of the lower chip 52-2 are connected to each other, and the second lead frame 54-3 of the upper chip 52-1 and the second lead frame 54-4 of the lower chip 52-2 are also connected to each other. The lead frames 54-1 to 54-4 are connected to a plurality of control signal applying pins of the upper and lower chips 52-1 and 52-2, respectively. The lead frames connected to a plurality of data input/output pins of the chips 52-1 and 52-2 are not connected to each other and are configured independent of each other. In other words, all first and second lead frames of the chips 52-1 and 52-2 except the lead frames connected to the data input/output pins of the chips 52-1 and 52-2 of 32M×8 bits are connected to each other, respectively. As a result, the multi-chip memory device has the same pin configuration as shown in FIG. 3. The first and second lead frames 54-1 and 54-2 of FIG. 5 are used as signal input/output pins.

FIG. 6 is a plan view illustrating a pin configuration of the SDRAM of a 54-pin TSOP type of 32M×8 bits. In FIG. 6, pin numbers 4, 7, 10, 15, 40, 42, 45, 48, and 51 denote a no-connection (NC) pin. In case of a multi-chip memory device wherein the two chips 52-1 and 52-2 are not packed into one package, the no-connection lead frames of the chip 52-1 may be connected with the data input/output (DQ0 to DQ7) lead frames of the chip 52-2. Therefore, the memory device can have the same pin configuration as shown in FIG. 3 and becomes an SDRAM of 32M×8 bits×2.

In the memory device of FIG. 5, the two chips 52-1 and 52-2 are simultaneously enabled in response to the chip select signal, and the system clock signal is enabled in response to the clock enable signal, so that data of 8 bits is input into or output from each of the two chips 52-1 and 52-2 in response to the system clock signal. However, since the two chips perform an input/output of data at the same time, excessive heat may be generated, whereby performance of the memory device may be reduced.

FIG. 7 is a plan view illustrating the memory devices of FIG. 5 mounted on the memory module of FIG. 1 and control signal lines on the main board. The memory module of FIG. 7 includes eight memory devices 12-1 to 12-4 and 22-1 to 224 of 32M×8 bits×2 and thus has a capacity of 512M bytes. In FIGS. 1 and 7, like reference numbers denote like parts.

The memory devices 12-1 to 12-4 arranged in a dotted line portion 10' are mounted on the front surface 10 of the memory module. Operation of the memory devices 12-1 and 12-2 is enabled in response to the chip select signal (CSB0), and the system clock signal (CLK0) is enabled in response to the clock enable signal (CKE0), so that data of 32 bits is input or output in response to the system clock signal (CLK0). Also, operation of the memory devices 12-3 and 12-4 is enabled in response to the chip select signal (CSB0), and the system clock signal (CLK1) is enabled in response to the clock enable signal (CKE0), so that data of 32 bits is input or output in response to the system clock signal (CLK1). That is, the memory devices 12-1 to 12-4 are enabled in response to the chip select signal (CSB0) and the clock enable signal (CKE0) and input or output data of 64 bits in response to the system clock signal (CLK0, CLK1).

The memory devices 22-1 to 22-4 arranged in a dotted line portion 20' are mounted on the rear surface 20 of the memory module. Operation of the memory devices 22-1 and 22-2 is enabled in response to the chi select signal (CSB1), and the system clock signal (CLK0) is enabled in response to the clock enable signal (CKE1), so that data of 32 bits is input or output in response to the system clock signal (CLK0). Also, operation of the memory devices 22-3 and 22-4 are enabled in response to the chip select signal (CSB1), and the system clock signal (CLK1) is enabled in response to the clock enable signal (CKE1), so that data of 32 bits input or output in response to the system clock signal (CLK1). That is, the memory devices 22-1 to 22-4 are enabled in response to the chip select signal (CSB1) and the clock enable signal (CKE1) and input or output data of 64 bits in response to the system clock signal (CLK0, CLK1).

However, as described above, conventional memory devices may have degraded performance due to heat that may be generated when the two chips perform an input/output of data at the same time.

SUMMARY OF THE INVENTION

Embodiments of the present invention provide multi-chip memory devices that include at least two integrated circuit memory chips, each of which includes a plurality of corresponding address pads, data pads and control signal pads, and a common package that encapsulates the at least two integrated circuit memory chips, and that includes a plurality of external terminals. An internal connection circuit in the common package is configured to connect at least one of the corresponding control signal pads of each of the integrated circuit memory chips to separate ones of the plurality of external terminals, to allow independent external control of each of the integrated circuit memory chips that are encapsulated in the common package. By allowing independent external control, the at least two integrated circuit memory chips may not be operated simultaneously. Accordingly, embodiments of the internal connection circuit in the common package can provide means for independently controlling each of the integrated circuit memory chips that are encapsulated in the common package, via at least one of the plurality of external terminals. Generation of heat in the multi-chip memory package therefore may be reduced.

In some embodiments, the at least two integrated circuit memory chips comprise at least two identical integrated circuit memory chips. In other embodiments, the at least one of the corresponding control circuit pads comprises a chip select signal pad, and the internal connection circuit in the common package is configured to connect the chip select signal pad of each of the integrated circuit memory chips to separate ones of the plurality of external terminals, to allow external chip selection of each of the integrated circuit memory chips that are encapsulated in the common package. In other embodiments, the at least one of the corresponding control circuit pads comprises a clock enable signal pad, and the internal connection circuit in the common package is configured to connect the clock enable signal pad of each of the integrated circuit memory chips to separate ones of the plurality of external terminals, to allow independent external clocking of each of the integrated circuit memory chips that are encapsulated in the common package. In yet other embodiments, the internal connection circuit is further configured to connect the corresponding data pads of each of the integrated circuit memory chips in common to a plurality of corresponding external terminals. In still other embodiments, the internal connection circuit is configured to connect the corresponding data pads of the integrated circuit memory chips to separate ones of the external terminals.

Multi-chip memory devices, according to any of the embodiments that were described above, may be combined to form memory modules according to embodiments of the invention. The memory modules include a memory module substrate having first and second opposing surfaces. At least one multi-chip memory device, as described above, is provided on the first surface and on the second surface.

In some embodiments of memory modules, the memory module substrate further comprises an external connection circuit that is configured to simultaneously enable only one of the at least two integrated circuit chips in each of the at least one multi-chip memory device on the first surface and on the second surface. In other embodiments, the external connection circuit is further configured to simultaneously enable only a corresponding one of the at least two integrated circuit chips in each of the at least one multi-chip memory device on the first surface and on the second surface. In yet other embodiments, the external connection circuit is further configured to simultaneously enable only a first of the at least two integrated circuit chips in each of at least one multi-chip memory device on the first surface, and to simultaneously enable only a second of the at least two integrated circuit chips in each of the at least one multi-chip memory device on the second surface. In still other embodiments, the external connection circuit is further configured to simultaneously enable only a first of the at least two integrated circuit chips in each of the at least one multi-chip memory devices on a first portion of the first surface and on a corresponding first portion of the second surface, and to simultaneously enable only a second of the at least two integrated circuit chips in each of the at least multi-chip memory devices on a second portion of the first surface and on a corresponding second portion of the second surface.

In other embodiments, the external connection circuit further comprises a first external system clock circuit that is configured to provide a first external system clock to the at least two integrated circuit memory chips in each of the at least one multi-chip memory device on the first surface and to provide a second external system clock signal to the at least two integrated circuit memory chips in each of the at least one multi-chip memory devices on the second surface. In yet other embodiments, the external connection circuit further comprises a first external system clock circuit that is configured to provide a first external system clock signal to the at least two integrated circuit memory chips in each of the at least one multi-chip memory devices on a first portion of the first surface and on a corresponding first portion of the second surface, and to provide a second external system clock signal to the at least two integrated circuit memory chips in each of the at least one multi-chip memory devices on a second portion of the first surface and on a corresponding second portion of the second surface.

According to method embodiments of the present invention, a multi-chip module device that comprises at least two integrated circuit memory chips and a common package that encapsulates the at least two integrated circuit memory chips and that includes a plurality of external terminals, is controlled by independently controlling each of the integrated circuit memory chips that are encapsulated in the common package, from external of the common package. Independent control may be provided, according to embodiments of the present invention, by independently selecting each of the integrated circuit memory chips that are encapsulated in the common package and/or by independently enabling a clock signal for each of the integrated circuit memory chips that are encapsulated in the common package.

According to other method embodiments, a memory module that includes a memory module substrate and at least one multi-chip memory device on the first surface and on the second surface thereof, is controlled by simultaneously enabling only one of the at least two integrated circuit memory chips in each of the at least one multi-chip memory devices on the first surface and on the second surface.

BRIEF DESCRIPTION OF THE DRAWINGS

FIG. 3 is a plan view illustrating a pin configuration of the SDRAM of the 54-pin TSOP type;

FIG. 6 is a plan view illustrating a pin configuration of a SDRAM of a 54-pin TSOP type of 32M×8 bits;

FIG. 8 is a plan view illustrating a pin configuration of multi-chip memory devices according to embodiments of the present invention;

DETAILED DESCRIPTION OF PREFERRED EMBODIMENTS

Figure 1A:
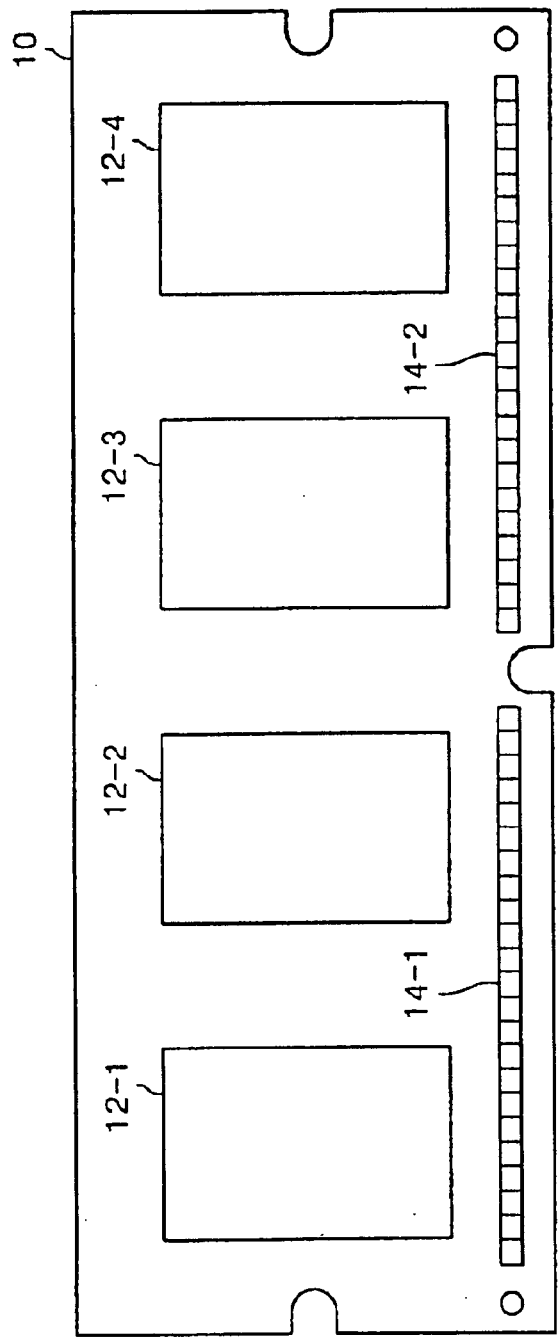
FIGS. 1A and 1B are plan views illustrating, respectively, configurations of a front surface and a rear surface of a conventional 144-pin/200-pin memory module.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 8 is a plan view illustrating a pin configuration of multi-chip memory devices according to embodiments of the present invention. Pin number 15 denotes a chip select signal (CSB1) applying pin. Pin number 40 denotes a clock enable signal (CKE1). Pin number 19 denotes a chip select signal (CSB0) applying pin. Pin number 37 denotes clock enable signal (CKE0) applying pin. The other pin configurations are similar to that of FIG. 6.

In conventional multi-chip memory devices, the chip select signal applying lead frames and the clock enable signal applying lead frames of the two chips are connected to each other. However, in the multi-chip memory device of FIG. 8, the chip select signal applying lead frames and/or the clock enable signal applying lead frames of the two chips are not connected to each other but are configured independent of each other. Thus, the lead frames provide an embodiment of an internal connection circuit in the common package that is configured to connect at least one of the corresponding control signal pads of each of the integrated circuit memory chips to separate ones of the plurality of external terminals, to allow independent external control of each of the integrated circuit memory chips that are encapsulated in the common package. Other embodiments of lead frames and/or other internal connection circuits may be provided.

Also, in conventional memory devices, eight data input/output lead frames of the two chips are not connected with each other but are configured independent of each other. However, in the pin configuration of embodiments of the multi-chip memory device of FIG. 8, eight data input/output lead frames of the two chips are connected with each other. Therefore, an operation of memory devices of FIG. 8 is enabled in response to the chip select signal (CSB0), and the system clock signal (CLK) is enabled in response to the clock enable signal (CKE0), so that data is input into or output from only one of the two chips. Also, an operation of the memory devices is enabled in response to the chip select signal (CSB1), and the system clock signal (CLK) is enabled in response to the clock enable signal (CKE1), so that data is input into or output from the other of the two chips. Thus, in embodiments of multi-chip memory devices of FIG. 8, the two chips in the package can be operated in response to different control signals from each other.

In the embodiments of FIG. 8, data input/output lead frames of the two chips are internally connected with each other and data input/output pins (DQ0 to DQ7) of 8 bits are externally configured. However, since the memory device of FIG. 8 has no-connection (NC) pins, the no-connection pins of FIG. 8 may connected with the data input/output pads of the other chip to externally configure the data input/output pins (DQ0 to DQ15) of 16 bits. Also, when the memory device does not need to be operated as a low power, the clock enable signal (CKE0, CKE1) applying pins may be connected to each other.

Figure 1B:
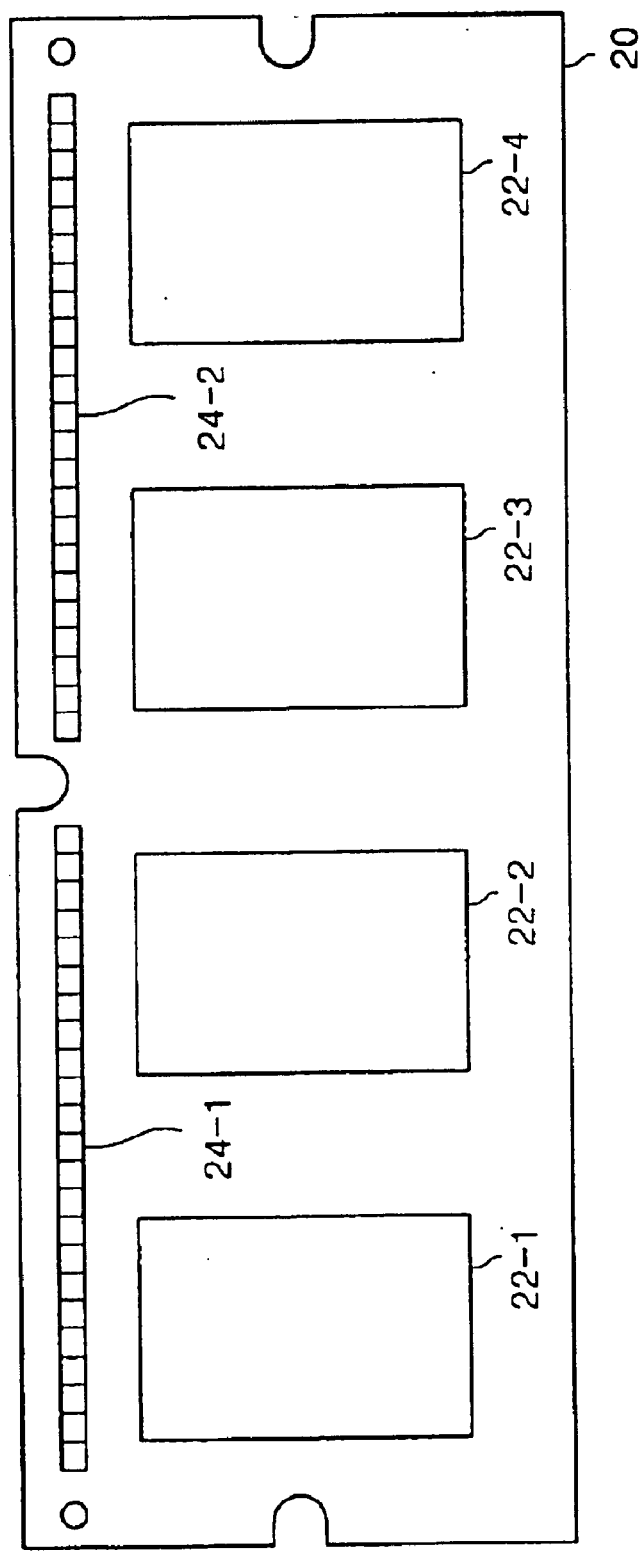
Figure 2:
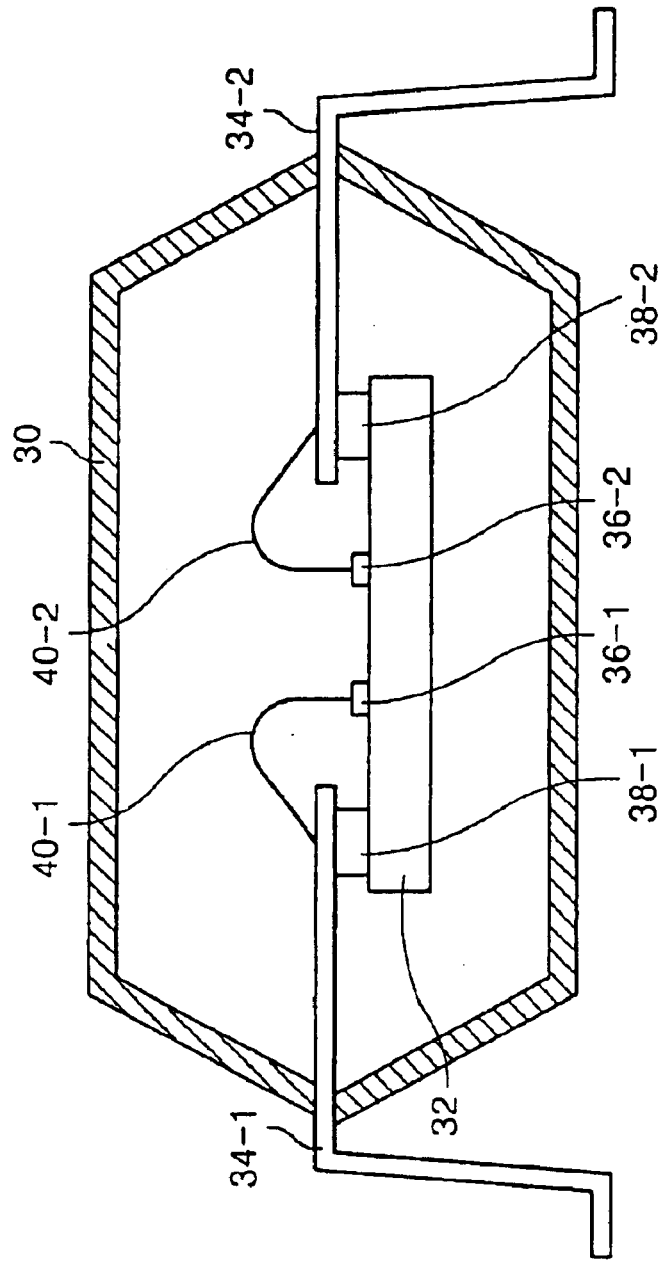
FIG. 2 is a cross-sectional view of an SDRAM of a TSOP type.
Figure 4:
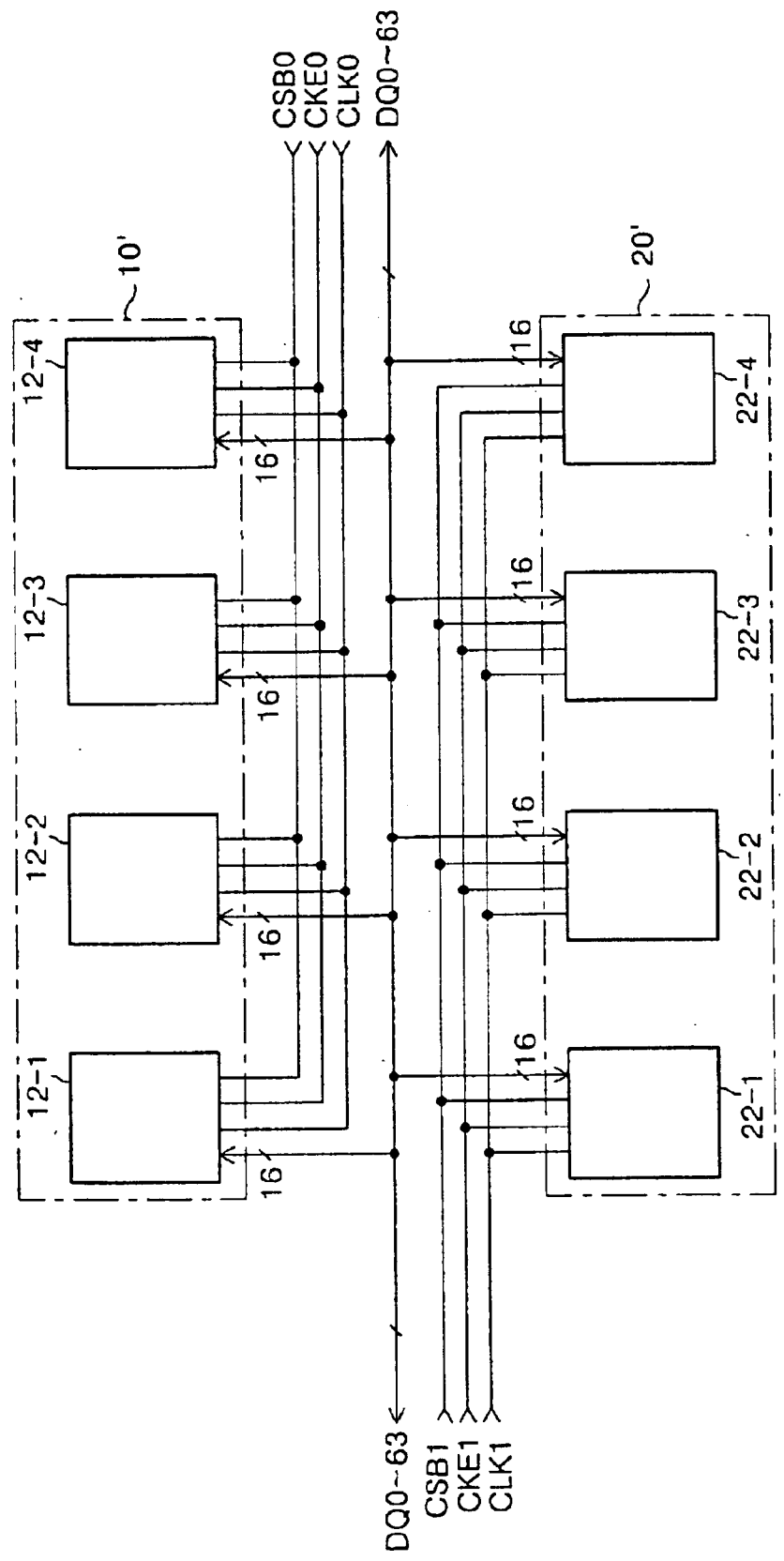
FIG. 4 is a plan view illustrating the memory devices mounted on the memory module of FIGS. 1A and 1B.
Figure 5:
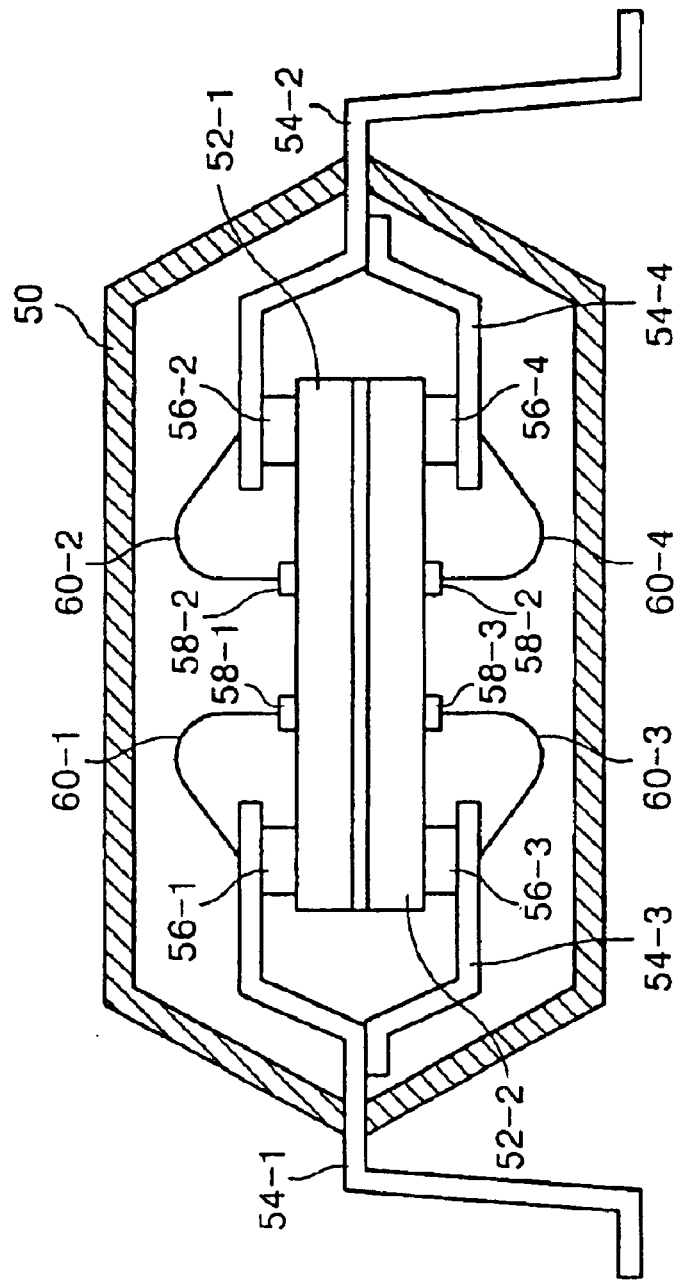
FIG. 5 is a cross-sectional view of a memory device wherein two chips are packed into one package.
Figure 7:
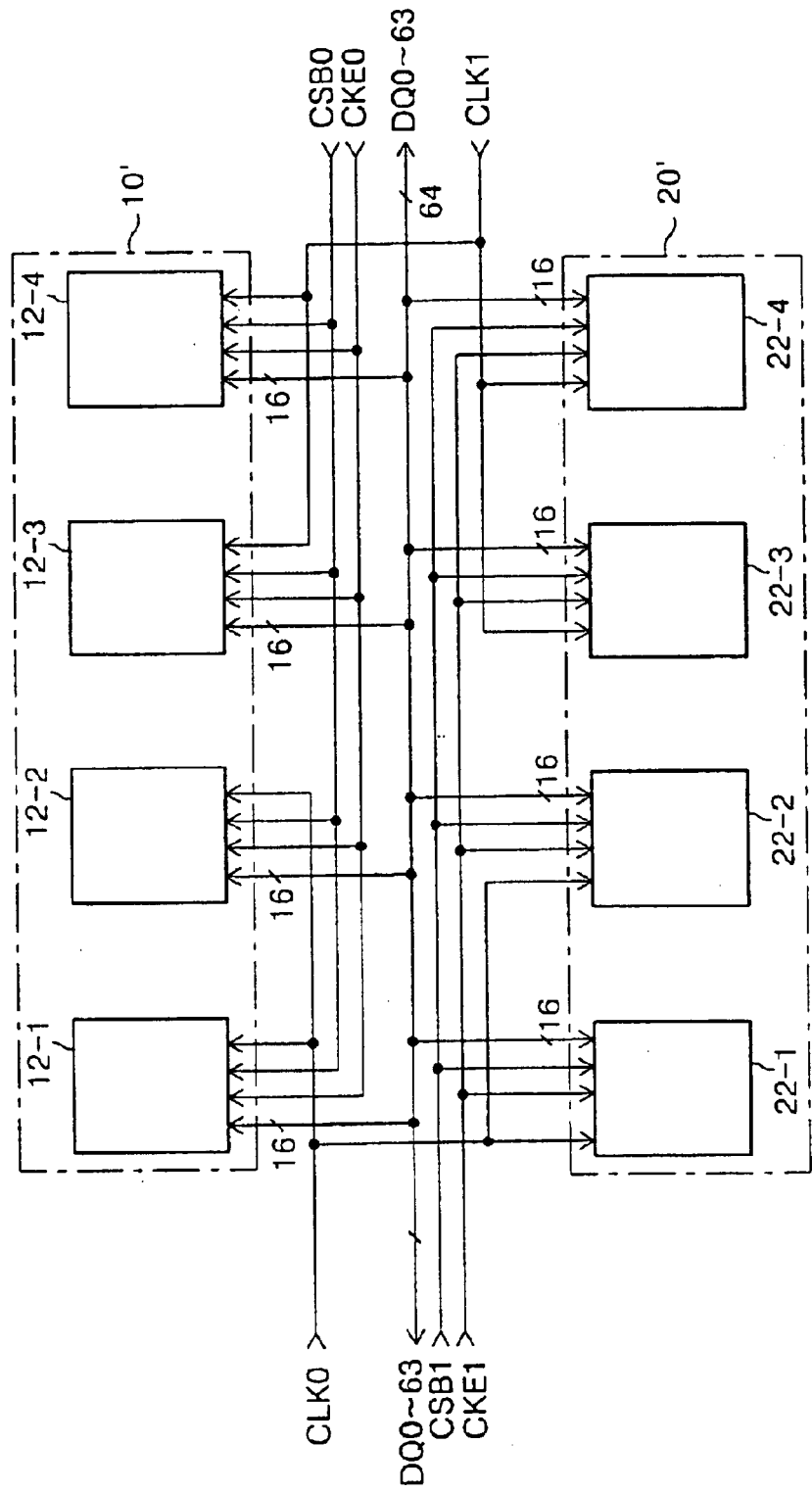
FIG. 7 is a plan view illustrating the memory devices of FIG. 5 mounted on the memory module of FIG. 1.
Figure 9:
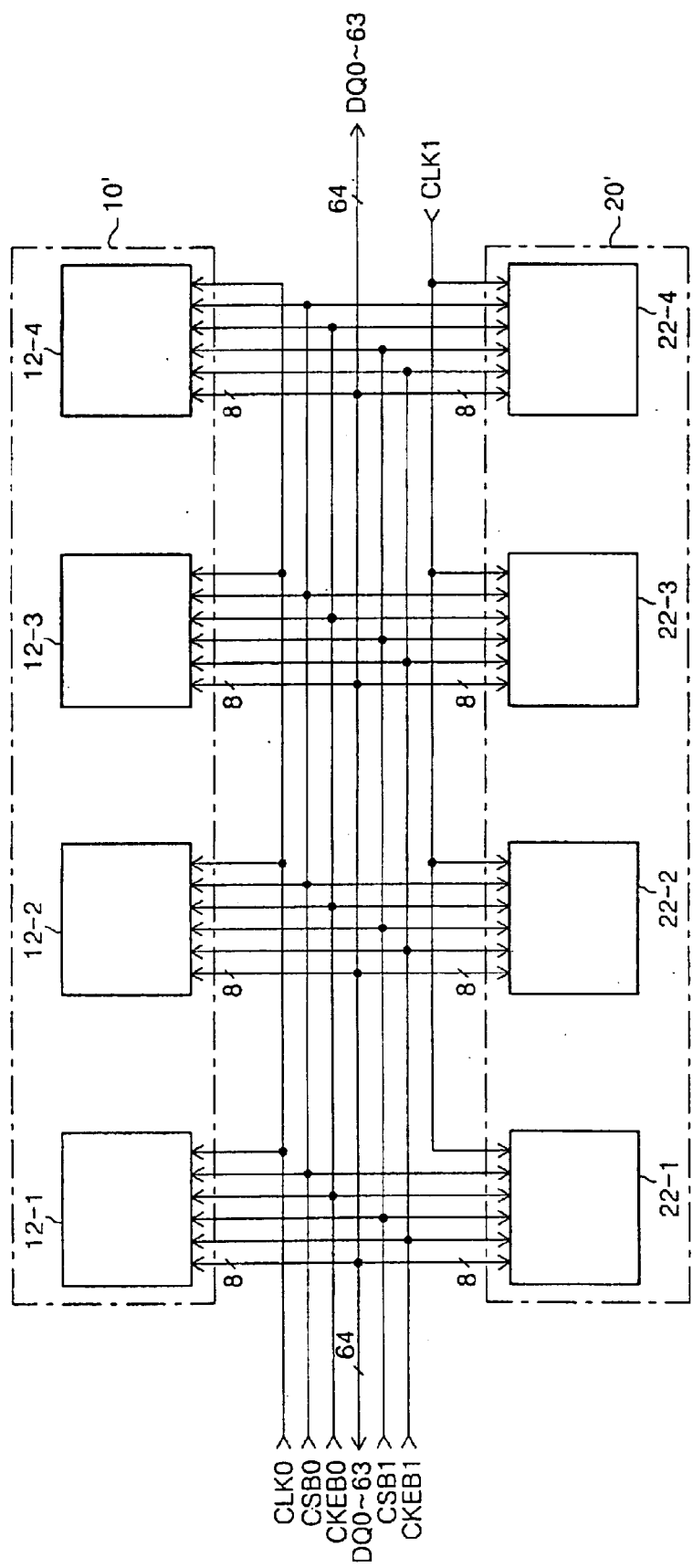
FIG. 9 is a plan view illustrating multi-chip memory devices according to embodiments of the present invention mounted on a memory module according to embodiments of the present invention.

FIG. 9 is a plan view illustrating multi-chip memory devices according to embodiments of the present invention mounted on a memory module substrate according to embodiments of the present invention. The memory module has eight multi-chip memory devices of 32M×8 bits×2 and thus has a capacity of 512M byte. In FIGS. 1 and 9, like reference numerals denote like parts.

The memory devices 12-1 to 12-4 arranged in a dotted line portion 10' are mounted on the front surface 10 of the memory module substrate. An operation of one chip of each memory devices 12-1 to 12-4 is enabled in response to the chip select signal (CSB0), and the system clock signal (CLK0) is enabled in response to the clock enable signal (CKE0), so that data of 8 bits is input or output in response to the system clock signal (CLK0). Also, an operation of the other chip of each memory devices 12-1 to 12-4 is enabled in response to the chip select signal (CSB1), and the system clock signal (CLK1) is enabled in response to the clock enable signal (CKE1), so that data of 8 bits is input or output in response to the system clock signal (CLK1).

The memory devices 22-1 to 22-4 arranged in a dotted line portion 20' are mounted on the rear surface 20 of the memory module substrate. An operation of only one chip of each memory devices 22-1 to 22-4 is enabled in response to the chip select signal (CSB0), and the system clock signal (CLK0) is enabled in response to the clock enable signal (CKE0), so that data of 8 bits are input or output in response to the system clock signal (CLK0). Also, an operation of the other chip of each memory devices 22-1 to 22-4 is enabled in response to the chip select signal (CSB1), and the system clock signal (CLK1) is enabled in response to the clock enable signal (CKE1), so that data of 8 bits are input or output in response to the system clock signal (CLK1).

In other words, the upper (or lower) chips of the memory devices 12-1 to 124 and 22-1 to 22-4 are simultaneously operated by the chip select signal (CSB0) and the clock enable signal (CKE0), and the lower (or upper) chips of the memory devices 12-1 to 12-4 and 22-1 to 22-4 are simultaneously operated by the chip select signal (CSB1) and the clock enable signal (CKE1). Therefore, data of 8 bits is input into or output from each of the memory devices 12-1 to 12-4 and 22-1 to 22-4, and thus data of total 64 bits is input into or output from the memory module.

In embodiments of FIG. 9, the upper chips and the lower chips of the memory devices 12-1 to 12-4 and 22-1 to 22-4 are not operated simultaneously. Since the upper chips and the lower chips of the front and rear surfaces are alternatingly operated, the heat generated may be reduced compared to when the upper and lower chips are operated simultaneously.

Figure 10:
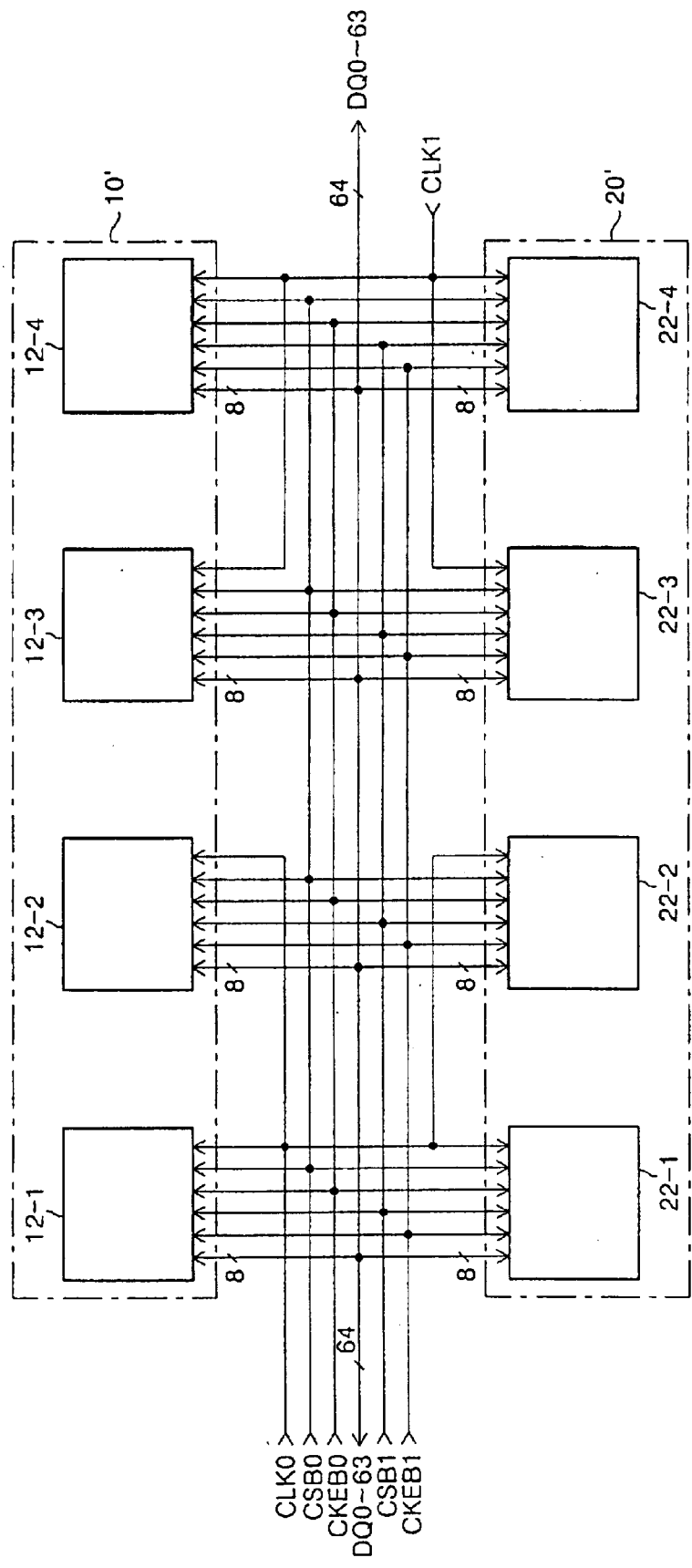
FIG. 10 is a plan view illustrating multi-chip memory devices according to embodiments of the present invention mounted on a memory module according to other embodiments of the present invention.

FIG. 10 is a plan view illustrating multi-chip memory devices according to embodiments of the present invention mounted on a memory module substrate according to other embodiments of the present invention. In the memory module of FIG. 10, the system clock signal (CLK0) is applied to the memory devices 12-1 and 12-2 arranged in the dotted line portion 10' and the memory devices 22-1 and 22-2 arranged in the dotted line portion 20', and the system clock signal (CLK1) is applied to the memory devices 12-3 and 12-4 arranged in the dotted line portion 10' and the memory devices 22-3 and 22-4 arranged in the dotted line portion 20'. Therefore, since the system clock signals (CLK0, CLK1) are divided and applied to some of the memory devices on the front surface and some of the memory devices on the rear surface, the load of the system clock signal line may be reduced, which can provide increased signal transmission speed. Also, since the upper and lower chips of the memory devices are not operated simultaneously, performance can be improved.

In the above embodiments, the multi-chip memory devices have at least two chips in the package. When a multi-chip memory device has three chips in the package, multi-chip memory devices according to embodiments of the invention may be configured in such a way that the chip select signal applying pins of the two chips and two clock enable signal applying pins are connected to each other, and the data input/output pins of the three chips are connected to each other. Alternatively, embodiments of multi-chip memory devices may be configured in such a way that three chip select signal applying pins of the three chips and three clock enable signal applying pins are externally configured, and the data input/output pins of three chips are connected to each other.

Similarly, in memory modules according to embodiments of the present invention in which each of a plurality of multi-chip memory devices including three chips are mounted, the memory modules may be configured in such a way that data is input into or output from one or more of the three chips of each of a plurality of the memory devices in response to two chip select signals and two clock enable signals, or in response to three chip select signals and three clock enable signals.

As described above, in multi-chip memory devices according to embodiments of the present invention, since the chips in the multi-chip memory devices are individually operated, heat may be reduced and, therefore, the performance of the memory devices may be improved. Also, in memory modules according to some embodiments of the present invention, since the chips in the memory device may be individually operated, heat may be reduced and, therefore, the performance of the memory modules may be improved. In addition, memory modules and control methods according to embodiments of the present invention can improve the reliability of module operation because chips in the memory device can be independently operated. Thus, overheating may be reduced or eliminated.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A multi-chip memory device, comprising:
   at least two integrated circuit memory chips, each of which includes a plurality of corresponding address pads, data pads and control signal pads;
   a common package that encapsulates the at least two integrated circuit memory chips so as to thermally couple the memory chips in the common package and that includes a plurality of external terminals; and
   an internal connection circuit in the common package that is configured to connect at least one of the corresponding control signal pads of each of the integrated circuit memory chips to separate ones of the plurality of external terminals to allow independent external control of each of the integrated circuit memory chips that are encapsulated in the common package so as to reduce heat in the common package compared to common external control of the integrated circuit memory chip that are encapsulated in the common package.

2. A multi-chip memory device according to claim 1 wherein the at least two integrated circuit memory chips comprise at least two identical integrated circuit memory chips.

3. A multi-chip memory device according to claim 1 wherein the at least one of the corresponding control circuit pads comprises a chip select signal pad and wherein the internal connection circuit in the common package is configured to connect the chip select signal pad of each of the integrated circuit memory chips to separate ones of the plurality of external terminals to allow independent external chip selection of each of the integrated circuit memory chips that are encapsulated in the common package.

4. A multi-chip memory device according to claim 3 wherein the at least one of the corresponding control circuit pads comprises a clock enable signal pad and wherein the internal connection circuit in the common package is configured to connect the clock enable signal pad of each of the integrated circuit memory chips to separate ones of the plurality of external terminals to allow independent external clocking of each of the integrated circuit memory chips that are encapsulated in the common package.

5. A multi-chip memory device according to claim 1 wherein the at least one of the corresponding control circuit pads comprises a clock enable signal pad and wherein the internal connection circuit in the common package is configured to connect the clock enable signal pad of each of the integrated circuit memory chips to separate ones of the plurality of external terminals to allow independent external clocking of each of the integrated circuit memory chips that are encapsulated in the common package.

6. A multi-chip memory device according to claim 1 wherein the internal connection circuit in the common package is further configured to connect the corresponding data pads of each of the integrated circuit memory chips in common to a plurality of corresponding external terminals.

7. A multi-chip memory device according to claim 1 in combination with a memory module substrate including first and second opposing surfaces, wherein the multi-chip memory device is a first multi-chip memory device and is on the first surface, and in further combination with a second multi-chip memory device on the second surface, the second multi-chip memory device comprising:
   at least two integrated circuit memory chips, each of which includes a plurality of corresponding address pads, data pads and control signal pads;
   a common package that encapsulates the at least two intergrated circuit memory chips so as to thermally couple the memory chips in the common package and that includes a plurality of external terminals; and an internal connection circuit in the common package that is configured to connect at least one of the corresponding control signal pads of each of the integrated circuit memory chips to separate ones of the plurality of external terminals to allow independent external control of each of the integrated circuit memory chips that are encapsulated in the common package so as to reduce heat in the common package compared to common external control of the integrated circuit memory chips that are encapsulated in the common package.

8. A multi-chip memory device according to claim 1 wherein the internal connection circuit in the common package is further configured to separately connect the corresponding data pads of cash of the integrated circuit memory chips to separate ones of the external terminals.

9. A multi-chip memory device, comprising:

at least two integrated circuit memory chips, each of which includes a plurality of corresponding address pads, data pads and control signal pads;

a common package that encapsulates the at least two integrated circuit memory chips so as to thermally couple the memory chips in the common package and that includes a plurality of external terminal; and means for independently controlling each of the integrated circuit memory chips that are encapsulated in the common package so as to reduce heat in the common package compared to common control of the integrated circuit memory chips that are encapsulated in the common package, via at least one of the plurality of external terminals.

10. A multi-chip memory device according to claim 9 wherein the means for independently controlling comprises an internal connection circuit in the common package that is configured to connect at least one of the corresponding control signal pads of each of the integrated circuit memory chips to separate ones of the plurality of external terminals to allow independent external control of each of the integrated circuit memory chips that are encapsulated in the common package.

11. A memory module comprising:

a memory module substrate including first and second opposing surfaces;

at least one multi-chip memory device on the first surface and on the second surface, each of the multi-chip memory devices comprising:

at least two integrated circuit memory chips, each of which includes a plurality corresponding address pads, data pads and control signal pads;

a common package that encapsulates the at least two integrated circuit memory chips so as to thermally couple the memory chips in the common package and that includes a plurality of external terminals; and an internal connection circuit in the common package that is configured to connect at least one of the corresponding control signal pads of each of the integrated circuit memory chips to separate ones of the plurality of external terminals to allow independent external control of each of the integrated circuit memory chips that are encapsulated in the common package so as to reduce heat in the common package compared to common external control of the integrated circuit memory chips that are encapsulated in the common package.

12. A module according to claim 11 wherein the at least two integrated circuit memory chips comprise at least two identical integrated circuit memory chips.

13. A memory module according to claim 11 wherein the at least one of the corresponding control circuit pads comprises a chip select signal pad and wherein the internal connection circuit in the common package is configured to connect the chip select signal pad of each of the integrated circuit memory chips to separate ones of the plurality of external terminals to allow independent external chip selection of each integrated circuit memory chips that are encapsulated in the common package.

14. A memory module according to claim 11 wherein the at least one of the corresponding control circuit pads comprises a clock enable signal pad and wherein the internal connection circuit in the common package is configured to connect the clock enable signal pad of each of the integrated circuit memory chips to separate ones of the plurality of external terminals to allow independent external clocking of each of the integrated circuit memory chips that are encapsulated in the common package.

15. A memory module according to claim 11 wherein the internal connection circuit in the common package is further configured to connect the corresponding data pads of each of the integrated circuit memory chips in common to a plurality of corresponding external terminal.

16. A memory module according to claim 1 wherein the memory module substrate further comprises an external connection circuit that is configured to simultaneously enable only one of the at least two integrated circuit memory chips in each of the at least one multi-chip memory device on the first surface and on the second surface.

17. A memory module according to claim 16 wherein the external connection circuit is further configured to simultaneously enable only a corresponding one of the at least two integrated circuit memory chips in each of the at least one multi-chip memory device on the first surface and on the second surface.

18. A memory module according to claim 16 wherein the external connection circuit is further configured to simultaneously enable only a first of the at least two integrated circuit memory chips in each of the at least one multi-chip memory device on the first surface and to simultaneously enable only a second of the at least two integrated circuit memory chips in each of the at least one multi-chip memory device on the second surface.

19. A memory module according to claim 16 wherein the external connection circuit further comprises a first external system clock circuit that is configured to provide a first external system clock signal to the at least two integrated circuit memory chips in each of the at least one multi-chip memory device on the first surface and to provide a second external system clock signal to thermal least two integrated circuit memory chips in each of the at least one multi-chip memory device on the second surface.

* * * * *

UNITED STATES PATENT AND TRADEMARK OFFICE
CERTIFICATE OF CORRECTION

PATENT NO. : 6,768,660 B2
DATED : July 27, 2004
INVENTOR(S) : Kong et al.

It is certified that error appears in the above-identified patent and that said Letters Patent is hereby corrected as shown below:

Column 11,
Line 17, should read -- corresponding data pads of each of the integrated circuit --
Line 51, should read -- which includes a plurality of corresponding address --

Column 12,
Line 7, should read -- 12. A memory module according to claim 11 wherein the at least --
Line 32, should read -- 16. A memory module according to claim 11 wherein the --
Line 58, should read -- external system clock signal to the at least two integrated --

Signed and Sealed this

Seventh Day of December, 2004

JON W. DUDAS
*Director of the United States Patent and Trademark Office*